(12) United States Patent
Huang et al.

(10) Patent No.: US 8,673,722 B2
(45) Date of Patent: Mar. 18, 2014

(54) STRAINED CHANNEL FIELD EFFECT TRANSISTOR AND THE METHOD FOR FABRICATING THE SAME

(75) Inventors: Ru Huang, Beijing (CN); Quanxin Yun, Beijing (CN); Xia An, Beijing (CN); Yujie Al, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 302 days.

(21) Appl. No.: 13/255,443

(22) PCT Filed: Mar. 23, 2011

(86) PCT No.: PCT/CN2011/072064
§ 371 (c)(1),
(2), (4) Date: Sep. 8, 2011

(87) PCT Pub. No.: WO2011/160477
PCT Pub. Date: Dec. 29, 2011

(65) Prior Publication Data
US 2013/0043515 A1 Feb. 21, 2013

(30) Foreign Application Priority Data
Jun. 25, 2010 (CN) .......................... 2010 1 0219179

(51) Int. Cl.
*H01L 21/336* (2006.01)
(52) U.S. Cl.
USPC .......................................... 438/294; 257/288
(58) Field of Classification Search
USPC ......... 438/135, 142, 197, 163, 199, 783, 200, 438/360, 301, 294–300, 303, 322, 694; 257/288, 294–298, E29.255, E21.409, 257/E21.19, E21.21, E21.619, E21.209, 257/E21.206, E29.242, E29.194
See application file for complete search history.

(56) References Cited

U.S. PATENT DOCUMENTS

| | | | |
|---|---|---|---|
| 7,544,997 B2 * | 6/2009 | Zhang et al. | 257/344 |
| 7,923,346 B2 * | 4/2011 | Curatola et al. | 438/427 |
| 2005/0189589 A1 | 9/2005 | Zhu et al. | |
| 2006/0202278 A1 | 9/2006 | Shima et al. | |
| 2007/0018236 A1 * | 1/2007 | Tsuchiaki | 257/324 |

FOREIGN PATENT DOCUMENTS

| | | |
|---|---|---|
| CN | 101211964 | 7/2008 |
| CN | 101326621 A | 12/2008 |
| CN | 101578692 A | 11/2009 |
| CN | 101924139 | 12/2010 |

\* cited by examiner

*Primary Examiner* — Julio J Maldonado
*Assistant Examiner* — Robert Bachner
(74) *Attorney, Agent, or Firm* — Bozicevic, Field & Francis LLP; Bret E. Field; Daniel G. Stoddard

(57) ABSTRACT

The present invention discloses a strained channel field effect transistor and a method for fabricating the same. The field effect transistor comprises a substrate, a source/drain, a gate dielectric layer, and a gate, characterized in that, an "L" shaped composite isolation layer, which envelops a part of a side face of the source/drain adjacent to a channel and the bottom of the source/drain, is arranged between the source/drain and the substrate; the composite isolation layer is divided into two layers, that is, an "L" shaped insulation thin layer contacting directly with the substrate and an "L" shaped high stress layer contacting directly with the source and the drain. The field effect transistor of such a structure improves the mobility of charge carriers by introducing stress into the channel by means of the high stress layer, while fundamentally improving the device structure of the field effect transistor and improving the short channel effect suppressing ability of the device.

5 Claims, 9 Drawing Sheets

STRAINED CHANNEL FIELD EFFECT TRANSISTOR AND THE METHOD FOR FABRICATING THE SAME

FIELD OF THE INVENTION

The present invention refers to the field of field effect transistor logic device and circuit in the CMOS ultra large scale integrated circuit (ULSI), and may be extended to the field of memory device and circuit, and in particular relates to a field effect transistor in which stress is introduced into the channel.

BACKGROUND OF THE INVENTION

With the size of CMOS device being continuously scaled down, the influences of the short channel effect and the charge carrier mobility deterioration effect in the device are increasingly serious. With respect to the development of the silicon based CMOS technology, the requirements for the ability of suppressing the short channel effect and the ability of improving the charge carrier mobility in the device become more and more urgent.

In order to suppress the short channel effect, conventional methods mainly include increasing the doping concentration in a substrate, adding source/drain lightly doping region (LDD region), and introducing a pocket structure, etc; meanwhile, an ultra thin body structure may also be adopted in a silicon-on-insulator (SOI) device. However, to increase the doping concentration in a substrate will increase the threshold voltage and reduce the on-state current, to add the LDD region will increase the parasitic resistance, and to introduce the pocket structure may also result in the increasing of the doping level in the substrate; meanwhile, to adopt the ultra thin body structure may result in the increasing of source/drain series resistance, and at the same time the charge carrier mobility in the channel and the over-driving ability of the device will be greatly reduced due to the increasing of interface scattering and the self-heating effect, etc. In order to solve these technical contradictions, China patent publication CN1450653A suggests a quasi SOI device structure, as shown in FIG. 1, the key structure of which is an "L" shaped local insulation layer isolation wall 8 that is arranged between the source/drain and the body region and enveloping the source/drain; the ability of suppressing short channel effect of the device can be improved effectively by using the isolation wall instead of conventional pn junction isolation between the source/drain and the body region.

Meanwhile, when the feature size of a device enters into sub-100 nm regime, the short channel effect of the device is deteriorated, so that the method for obtaining better performance by further reducing the size of the device becomes extremely difficult. In order to relieve the pressure resulted from the reduction of the device size, stress is introduced into a channel by adopting strained-silicon technology so as to improve the charge carrier mobility in the channel and the performance of a transistor device, which has become a method widely adopted and indispensable in the engineering of microelectronic fabrication. Its basic principle is that, stress is introduced into a channel region of a transistor by means of the device structure, material and process design so that the lattice structure of crystals is varied, and thus leads to the variation of the charge carrier mobility. Under appropriate stress, charge carrier mobility may be improved. For example, the tensile stress in the channel direction may improve the electron mobility, and the compressive stress in the channel direction may improve the hole mobility.

It is critical for the strain technology that how to introduce the stress that is necessary to a device into a channel. The conventional methods for introducing stress mainly include:

1. Strain is produced in the channel portion by means of Si/SiGe heterojunction substrate structure. As shown in FIG. 2a, by adopting a non-silicon substrate, such as a SiGe substrate, stress is applied to the channel layer by means of the lattice difference between the substrate 10 and the surface Si channel layer. Since the lattice constant of SiGe is larger than that of Si, the lattice of the surface Si channel layer are stretched by the SiGe lattice of bottom layer in this case, so that stress is introduced into the Si channel.

2. Stress is introduced into the channel portion by means of heterojunction source/drain structure, that is, the Si material of the source/drain region is replaced by a non-silicon (non-Si) material, and stress is induced in the channel by means of the heterojunction between the source/drain and the channel. As shown in FIG. 2b, source/drain 12 is formed of SiGe having a large lattice, thus stress may be introduced in the channel direction.

3. Stress is introduced into the channel and the substrate by covering a high stress layer over the device, that is, a high stress thin film 13 is covered over the device, and deformation of the device under the thin film is induced by the deformation of the thin film itself, so that stress is introduced into the channel, as shown in FIG. 2c.

It is noted that the above mentioned methods for introducing stress into the channel have changed the mobility of charge carrier, but do not fundamentally improve the device structure, and thus can not effectively improve the short channel effect suppressing ability of the device itself.

SUMMARY OF THE INVENTION

An object of the present invention is to provide a strained channel field effect transistor, wherein stress necessary to improve the performance of the device may be introduced into the channel of the field effect transistor while ensuring that the field effect transistor is provided with excellent short channel effect suppressing ability in structure.

The technical solutions of the present invention are described as follows:

A strained channel field effect transistor comprises a substrate, a source/drain, a gate dielectric layer and a gate, characterized in that, an "L" shaped composite isolation layer, which envelops a part of a side surface of the source/drain adjacent to a channel and the bottom of the source/drain, is arranged between the source/drain and the substrate, wherein the composite isolation layer is divided into two layers, that is, an "L" shaped thin insulation layer contacting directly with the substrate and an "L" shaped high stress layer contacting directly with the source and drain.

In particular, in the field effect transistor according to the present invention, an "L" shaped composite isolation layer is provided between the source region and the substrate and between the drain region and the substrate, respectively. The "L" shaped composite isolation layers each includes a portion arranged between the source/drain region and the channel, which is perpendicular to the channel direction (the vertical portion of the "L"), and a portion arranged between the bottom of the source/drain region and the substrate, which is parallel to the channel direction (the horizontal portion of the "L"). The "L" shaped composite isolation layers each is a layered structure of two layers, wherein the thin insulation layer is adjacent to the substrate and is arranged between the substrate and the high stress layer; and the high stress layer is adjacent to the source/drain region and is arranged between the insulation thin layer and the source/drain region.

The portion from the top of the "L" shaped composite isolation layer to the surface of the channel is a connecting region of the source/drain region and the cannel; the end portion of the "L" shaped composite isolation layer (an end of the horizontal portion of the "L" shaped layer, which is far away from the channel) is connected with the isolation region of the active region; and the source/drain is completely isolated from the substrate through the "L" shaped composite isolation layer, so that a quasi SOI device structure is formed.

The material of the "L" shaped insulation thin layer is preferably silicon dioxide, or may be silicon nitride oxide, the thickness of which ranges from 0.5 to 20 nm.

The material of the "L" shaped high stress layer may be stress material such as high stress silicon nitride or high stress diamond-like carbon, etc., the thickness of which ranges from 5 to 200 nm.

FIG. 3 illustrates a typical structure of the field effect transistor according to the present invention, wherein a substrate 14 may be a silicon substrate, or may be of other semiconductor substrate materials, such as Ge, SiGe, GaAs, etc. A gate dielectric layer 17 may be a material such as silicon dioxide, aluminum oxide, yttrium oxide, lanthanum oxide, hafnium oxide or titanium oxide. A gate 18 may be polysilicon or may be a metallic material, such as aluminum, tungsten, tantalum, etc, or may be a metal nitride material, such as titanium nitride, tantalum nitride, etc. A gate sidewall 19 may be a material such as silicon dioxide, silicon nitride, silicon nitride oxide, etc. A source region 15 and a drain region 16 each is isolated from the substrate 14 through an "L" shaped composite isolation layer consisted of a thin insulation layer 20 and a high stress layer 21. The source region 15 and the drain region 16 each is connected with the channel only through the region from the top of the "L" shaped composite isolation layer to the surface of the channel.

The present invention also provides a method for fabricating the strained channel field effect transistor mentioned above, the method comprises following steps:

1) forming a silicon oxide sacrificial gate on a substrate by deposition and etching, and etching the substrate by using the silicon oxide sacrificial gate as a mask to obtain source/drain region recess;

2) forming an thin insulation layer on a surface of the source/drain region recess by means of low temperature thermal oxidation or deposition, and depositing a high stress material on the thin insulation layer to form a high stress layer;

3) depositing a polysilicon sacrificial layer on the high stress layer, and selectively etching the polysilicon sacrificial layer to a position of a designed height of the "L" shaped composite isolation layer;

4) selectively etching the high stress layer by using the polysilicon sacrificial layer as a protection layer. Then, removing the polysilicon sacrificial layer, and selectively etching the thin insulation layer by using the high stress layer as a protection layer to obtain the "L" shaped composite isolation layer consisted of the thin insulation layer and the high stress layer;

5) epitaxially growing a source/drain region by using the exposed channel region window as a seed layer, performing a light doping implantation, then depositing a silicon nitride layer, and performing source/drain implantation by using the silicon nitride layer as a protection layer;

6) subsequently depositing a silicon nitride layer, and performing a chemical mechanical polishing on the silicon nitride layer by using the silicon oxide sacrificial gate as a stop layer;

7) removing the silicon oxide sacrificial gate, performing a low temperature thermal oxidation to obtain a gate dielectric layer, depositing a polysilicon layer, and performing a chemical mechanical polishing by using the silicon nitride layer as a stop layer to obtain a polysilicon gate.

In the fabrication method mentioned above, low temperature thermal oxidation is preferably adopted in step 2) to form the "L" shaped thin silicon oxide isolation layer, a thickness of which is 0.5 to 20 nm.

The high stress material according to step 2) may be high stress silicon nitride or high stress diamond-like carbon, etc. Meanwhile, the high stress materials are classified into tensile stress materials and compressive stress materials, and materials with different internal stress properties are selected depending on the stress requirements for different devices. A thickness of the high stress layer is preferably 5 to 200 nm.

The strained channel field effect transistor according to the present invention is advantageous mainly in that:

I. The "L" shaped thin insulation layer is mainly used as an interface buffer layer between the high stress layer and the channel region and between the high stress layer and the substrate.

II. The deformation of the substrate in the channel region is induced through the deformation of the high stress layer material itself so as to achieve a strained channel.

III. Channel stress with different property may be obtained by adjusting the internal stress properties of the high stress layer dielectric material to meet the stress requirements of different devices, respectively. For example, tensile stress may be introduced into the channel by means of tensile stress dielectric material so as to improve the electron mobility in an N-type field effect transistor, while compressive stress may be introduced into the channel by means of compressive stress dielectric material so as to improve the hole mobility in a P-type field effect transistor.

IV. The magnitude of the channel stress may be adjusted by adjusting the magnitude of the internal stress in the high stress layer dielectric material and the thickness of the high stress layer. The channel stress will increase with the increasing of the internal stress in the high stress layer dielectric material and the increasing of the thickness of the high stress layer.

V. The "L" shaped composite isolation layer envelops the source/drain and isolates the source/drain completely from the substrate to form the quasi SOI structure as suggested in the Chinese patent publication CN1450653A, so that an excellent short channel effect suppressing property may be obtained.

The effect of the stress introduction according to the present invention may be confirmed preliminarily by the simulation experiment below.

The numerical simulation is performed on the simulation platform of Sentaurus TCAD. In the simulation, taking the N-type field effect transistor as an example, in the field effect transistor structure obtained by process simulation, the channel length is 30 nm; the "L" shaped thin insulation layer is silicon dioxide, the thickness of which is 1 nm; the material of the "L" shaped high stress layer is high stress silicon nitride, the thickness of which is 20 nm, and the internal stress of the high stress silicon nitride is about 8 GPa. The stress distribution along the channel direction of the transistor obtained through the simulation result is shown in FIG. 4(a) and FIG. 4(b). As a result, the channel stress has reached a magnitude of GPa, and a stress is applied effectively to the channel portion by the high stress layer; meanwhile, the channel stress presents a wave-peak distribution, as shown in FIG. 4b, that is, the peak value of the channel stress is in the central region of the channel, which is advantageous to improve the charge carrier mobility in the channel region to the greatest extent.

It can be seen from the simulation result that, the method for introducing stress according to the present invention is feasible and effective. Meanwhile, the field effect transistor based on the quasi SOI device structure according to the present invention may effectively suppress the short channel effect caused by the scaling-down of the device size. Therefore, compared with the conventional stress introduction methods, the present invention may ensure the effectiveness of introducing stress into the channel while improving the device structure of the field effect transistor fundamentally and improving the short channel effect suppressing ability of the device.

BRIEF DESCRIPTION OF THE DRAWINGS

FIGS. 2a to 2c are schematic diagrams illustrating three methods for applying stress commonly adopted in the field of microelectronic fabrication engineering, wherein FIG. 2a illustrates a method of adopting a heterojunction substrate; FIG. 2b illustrates a method of adopting a heterojunction source/drain; and FIG. 2c illustrates a method of adopting a stressed cover layer.

FIG. 4b is a stress distribution curve on the channel surface in the channel direction of the numerical simulated field effect transistor shown in FIG. 4a.

DETAILED DESCRIPTION OF THE EMBODIMENTS

With respect to the fabrication of a strained channel field effect transistor, the keys are the introduction of a composite isolation layer and the design of a self-aligned process. In the following embodiment, a high stress layer is obtained through deposition method, while the fabrication with self-aligned process is achieved by adopting a polysilicon sacrificial source/drain and a silicon oxide sacrificial gate.

Figure 1:
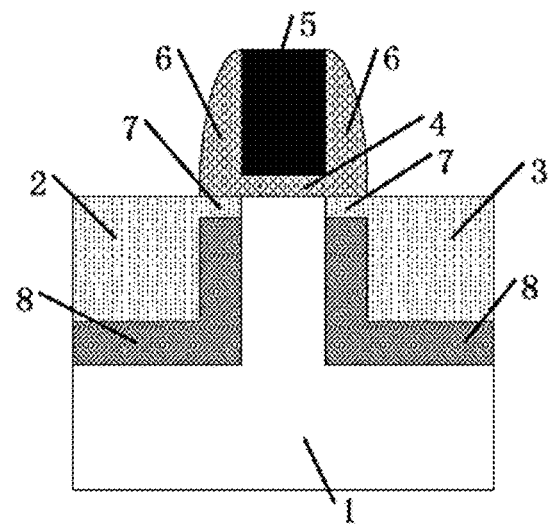
FIG. 1 is a schematic diagram illustrating a structure of a quasi SOI device as suggested in CN1450653A, in the figure, '1' represents a substrate, '2' and '3' represent a source region and a drain region, respectively, '4' represents a gate oxidation layer, '5' represents a gate electrode, '6' represents a gate sidewall, '7' represents a lightly doped source drain (LDD) region, '8' represents an "L" shaped local insulation layer isolation wall.
Figure 2A:
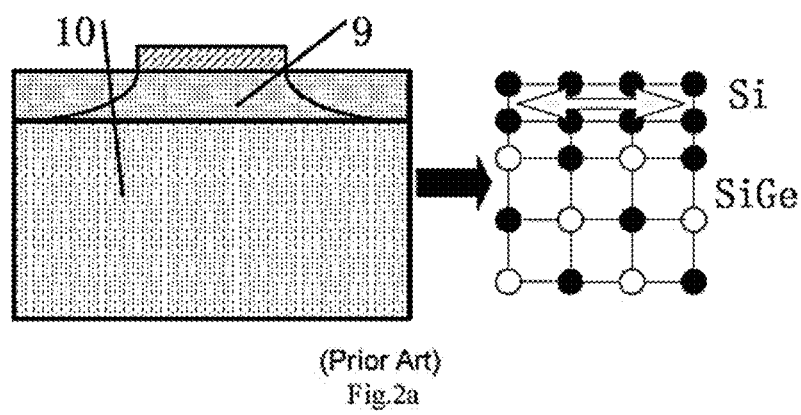
Figure 2B:
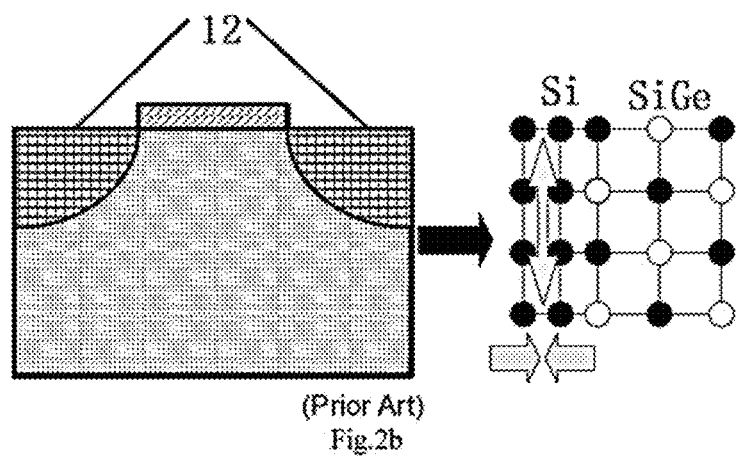
Figure 2C:
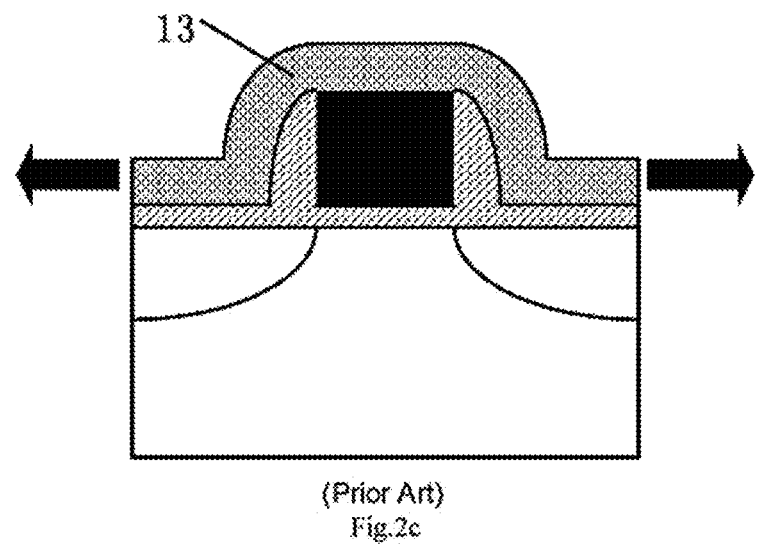
Figure 3:
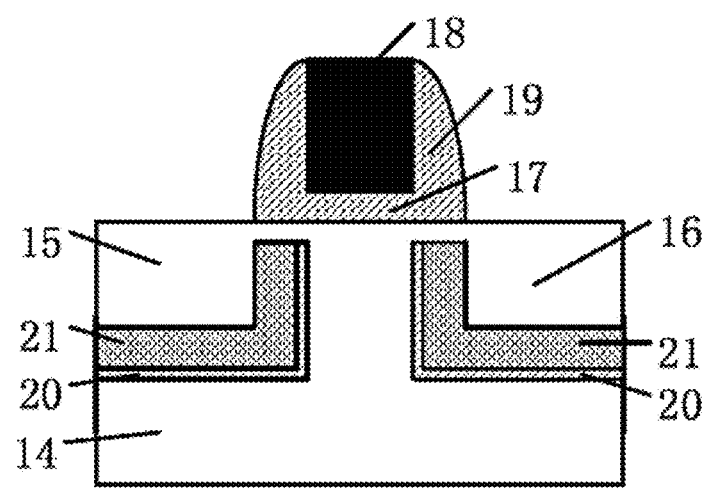
FIG. 3 illustrates a device structure for a strained channel field effect transistor according to the present invention, wherein '14' represents a substrate, '15' represents a source region, '16' represents a drain region, '17' represents a gate dielectric layer, '18' represents a gate, '19' represents a gate sidewall, '20' represents a insulation thin layer, and '21' represents a high stress layer.
Figure 4A:
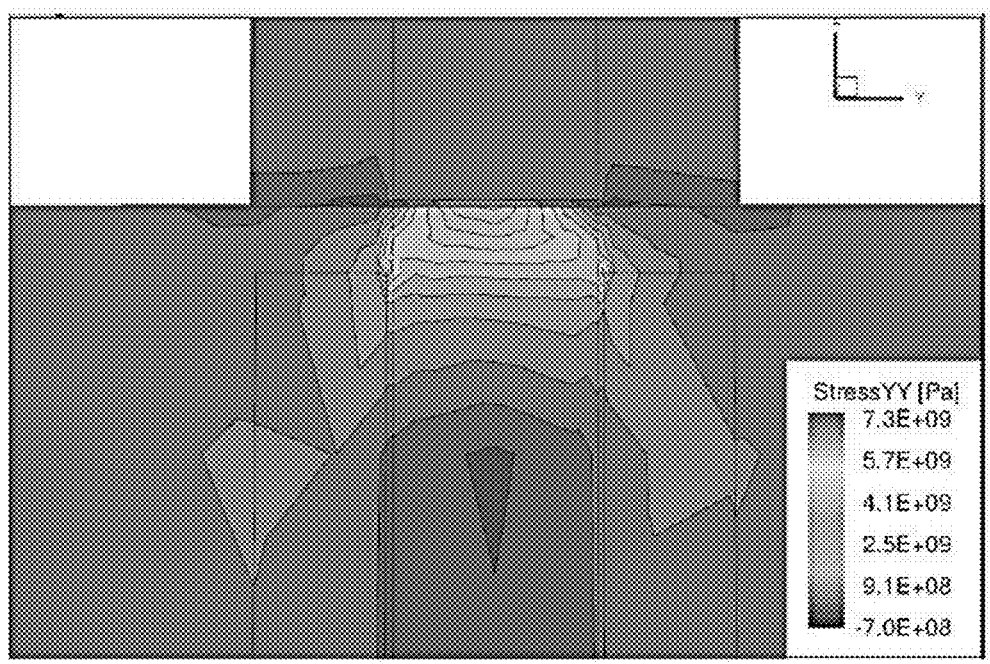
FIG. 4a is a channel stress distribution graph, which is obtained through numerical simulation by using stress introduction method accord to the present invention.
Figure 4B:
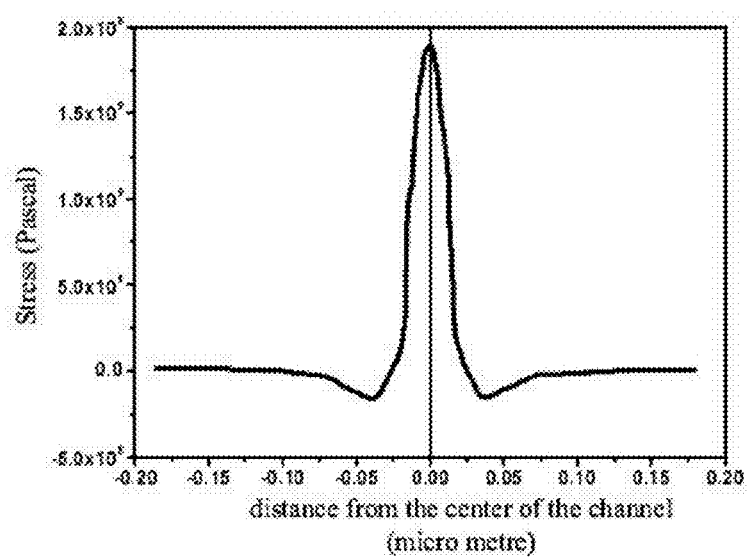
Figure 5A:
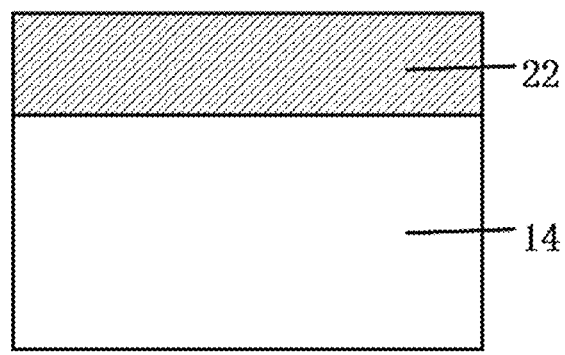
FIG. 5a to FIG. 5q are diagrams illustrating a flow of fabrication of the strained channel field effect transistor according to an embodiment of the present invention.
Figure 5B:
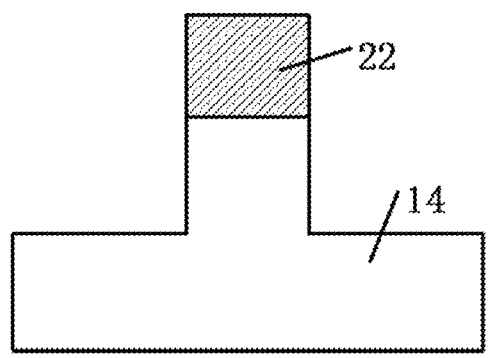
Figure 5C:
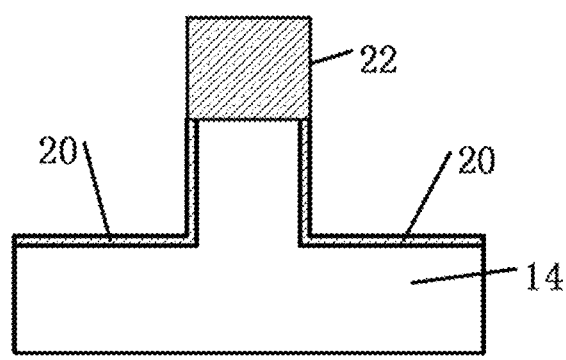
Figure 5D:
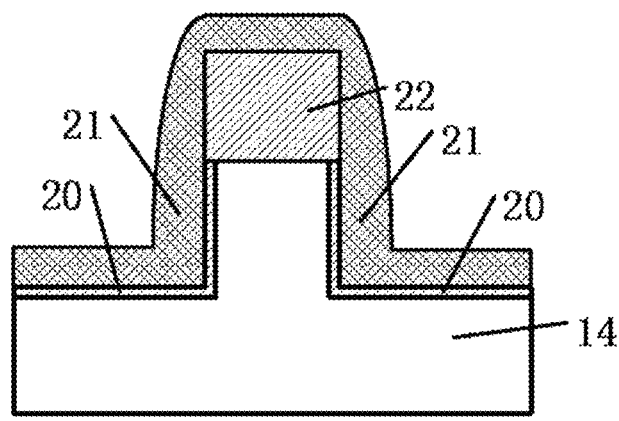
Figure 5E:
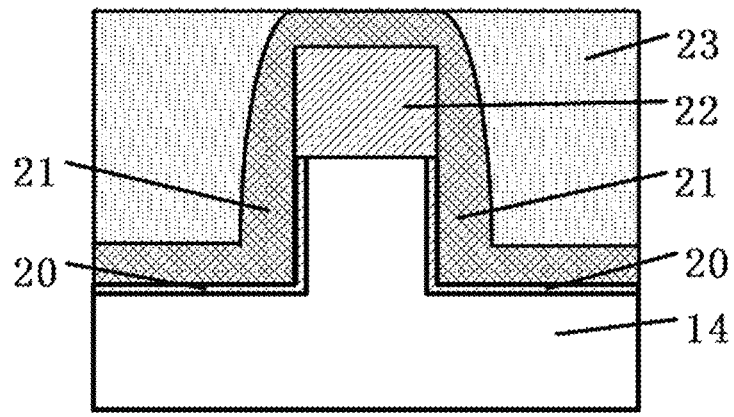
Figure 5F:
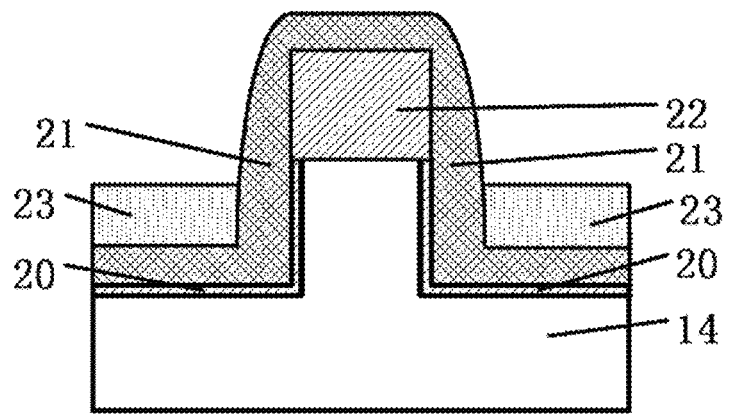
Figure 5G:
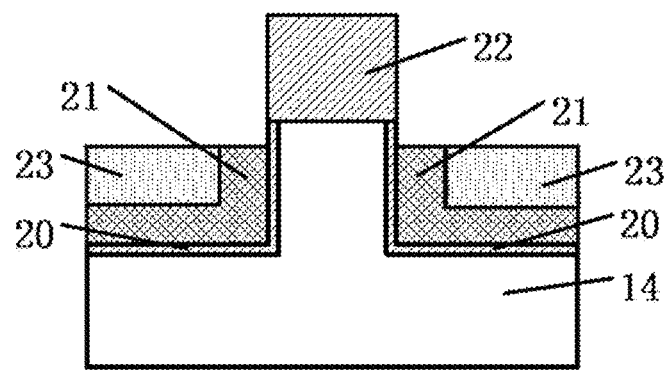
Figure 5H:
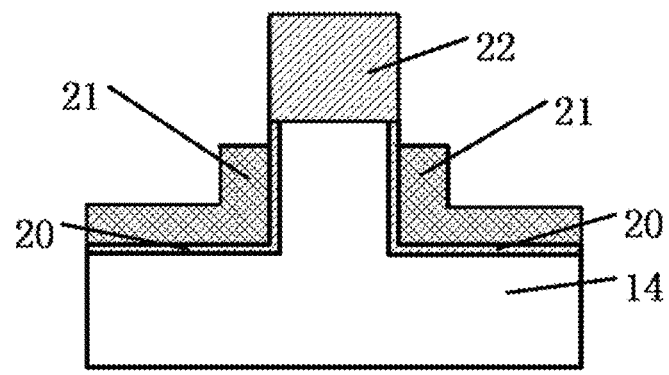
Figure 5I:
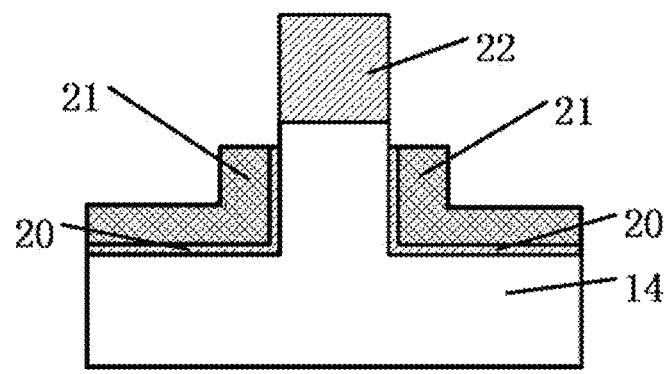
Figure 5J:
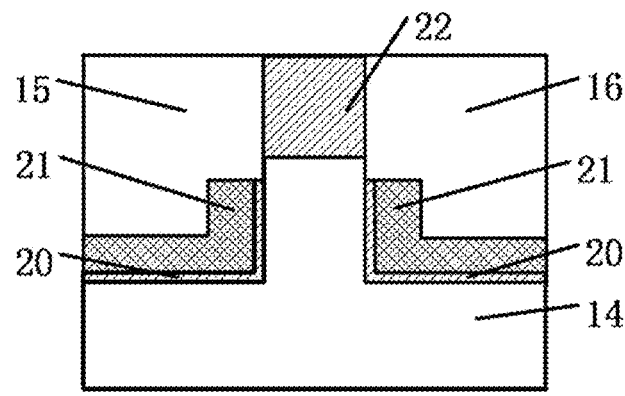
Figure 5K:
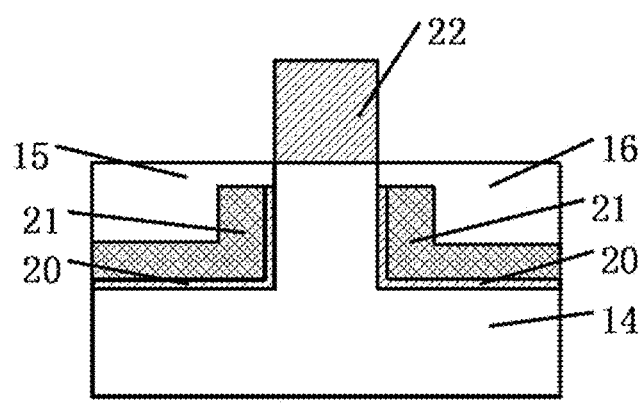
Figure 5L:
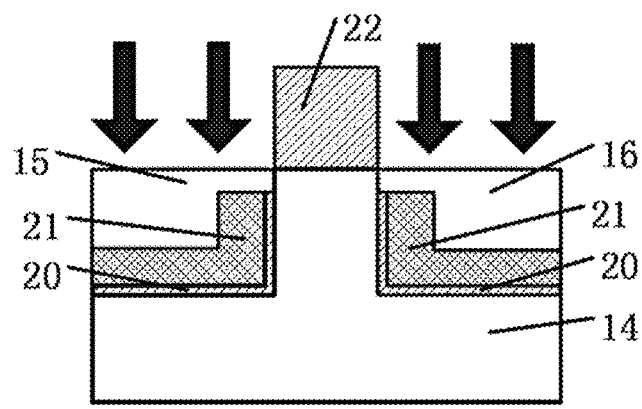
Figure 5M:
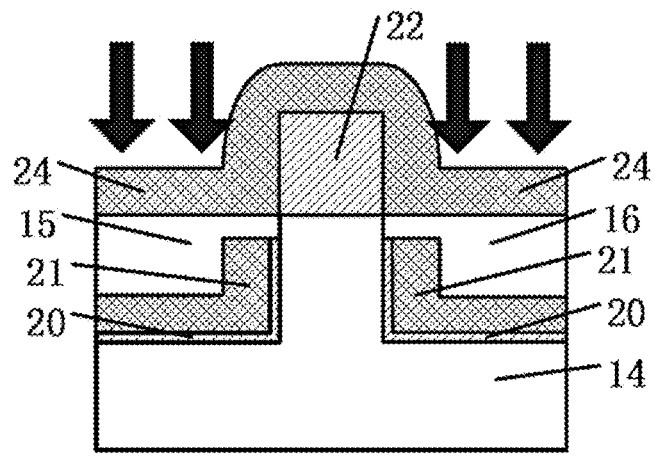
Figure 5N:
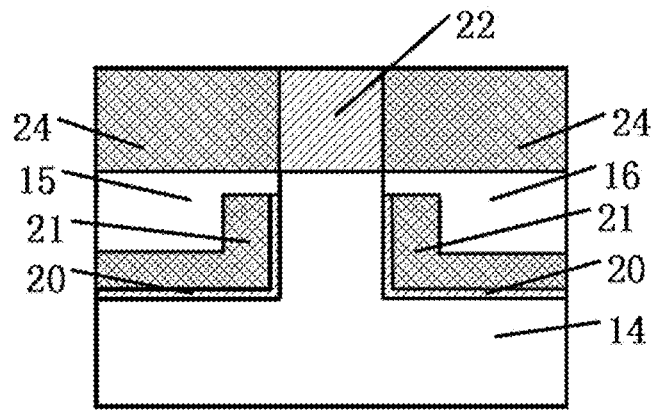
Figure 5O:
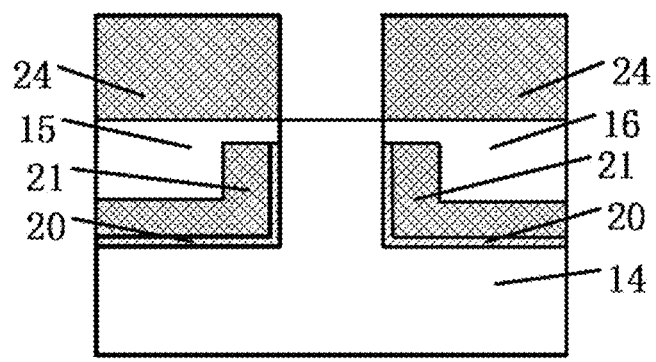
Figure 5P:
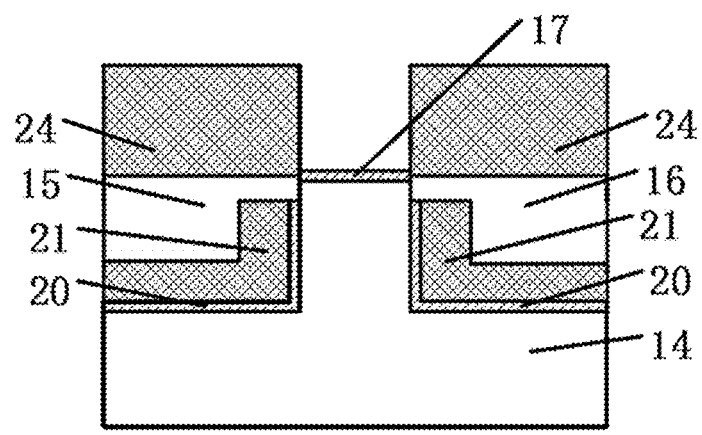
Figure 5Q:
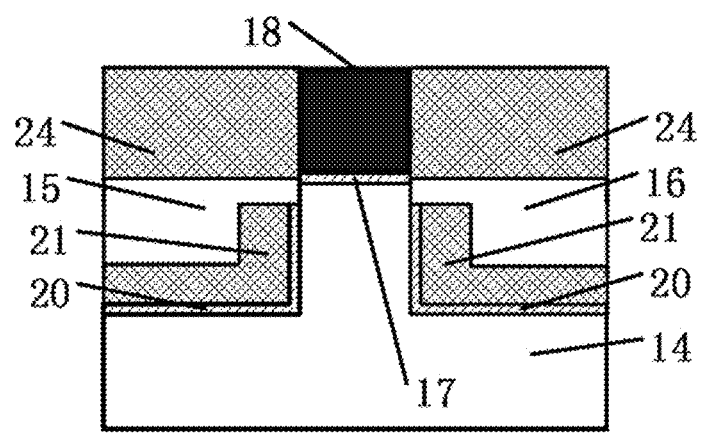

The fabrication of a strained channel field effect transistor according to the flow shown in FIG. 5a to FIG. 5q comprises the following steps:

1. performing a threshold adjusting implantation to a substrate 14 for one time, then, depositing a silicon oxide sacrificial layer, the thickness of the silicon oxide sacrificial layer is depending on the design requirements of the height of the polysilicon gate, as shown in FIG. 5a;

2. performing photolithography for silicon oxide dummy gate by using a polysilicon gate mask to obtain a silicon oxide sacrificial gate 22, and further etching the substrate material to obtain a source/drain region recess, the depth of the source/drain region recess is depending on the bottom position of the "L" shaped composite isolation layer, as shown in FIG. 5b;

3. forming a silicon dioxide layer, i.e., the insulation thin layer 20, which is used as a protection layer of the channel region, by performing low temperature thermal oxidation with respect to the substrate, wherein the oxidation thickness thereof is depending on a designed thickness of the insulation thin layer, as shown in FIG. 5c;

4. depositing a high stress silicon nitride layer 21, a thickness of which is depending on a designed thickness of the high stress layer, as shown in FIG. 5d;

5. depositing a polysilicon sacrificial layer 23, and performing a chemical mechanical polishing (CMP) on the polysilicon sacrificial layer 23 by using the high stress silicon nitride layer 21 as a stop layer, as shown in FIG. 5e;

6. selectively etching the polysilicon sacrificial layer 23 to the designed height of the composite isolation layer; in this case, a distance from the surface of the polysilicon sacrificial layer 23 to the surface of the substrate in the channel region is the thickness of the lightly doped region (LDD region), which is depending on the design requirement, as shown in FIG. 7f;

7. selectively etching the high stress silicon nitride layer 21 by using the polysilicon sacrificial layer 23 as a protection layer, as shown in FIG. 5g;

8. removing the polysilicon sacrificial layer 23 by selectively etching, as shown in FIG. 5h;

9. selectively etching the silicon dioxide insulation thin layer 20 by using the high stress silicon nitride layer 21 as a protection layer to expose the channel region window, as shown in FIG. 5i;

10. epitaxially growing silicon by using the channel region window as a seed layer, and performing a chemical mechanical polishing on the epitaxial layer by using the silicon oxide sacrificial gate 22 as a stop layer to obtain a source region 15 and a drain region 16, as shown in FIG. 5j;

11. etching the source/drain region to a depth reaching the surface of the substrate in the channel region to remove redundant source/drain material, as shown in FIG. 5k;

12. performing an implantation for lightly doped drain (LDD) for one time, as shown in FIG. 5l;

13. depositing a low stress silicon nitride layer 24, the thickness of which is depending on a designed length of the lightly doped drain region (LDD region), and performing an implantation with a high dosage for one time into the source region 15 and the drain region 16, as shown in FIG. 5m;

14. continuously depositing the low stress silicon nitride layer 24, and performing a chemical mechanical polishing on the low stress silicon nitride layer 24 by using the silicon oxide sacrificial gate 22 as a stop layer, as shown in FIG. 5n;

15. removing the silicon oxide sacrificial gate 22 by selective etching, as shown in FIG. 5o;

16. forming a silicon dioxide thin layer, that is, a gate dielectric layer 17, and the thickness of which is depending on the design thickness of the gate dielectric layer, by performing a low temperature thermal oxidation with respect to the substrate, as shown in FIG. 5p;

17. depositing a polysilicon layer, and performing a chemical mechanical polishing by using the low stress silicon nitride layer 24 as a stop layer to obtain a polysilicon gate 18, as shown in FIG. 5q;

18. after performing an implantation into the gate, a thermal annealing is performed for one time.

The embodiment described above is not intended to limit the present invention. Various changes and modifications can be made by those skilled in the art without departing from the spirit and the scope of the present invention. Therefore, the protection scope of the present invention is defined by the following claims.

What is claimed is:

1. A fabrication method of a field effect transistor comprising a substrate, a source/drain, a gate dielectric layer, and a gate, wherein, an "L" shaped composite isolation layer, which envelops a part of a side face of the source/drain adjacent to a channel and a bottom of the source/drain, is arranged between the source/drain and the substrate, the composite isolation layer being divided into two layers, that is, an "L" shaped thin insulation layer contacting directly with the substrate and an "L" shaped high stress layer contacting directly with the source/drain, the method comprising the following steps:
   1) forming a silicon oxide sacrificial gate on the substrate by deposition and etching, and etching the substrate by using the silicon oxide sacrificial gate as a mask to obtain a source/drain region recess;
   2) forming a recess-shaped insulation thin layer on a surface of the source/drain region recess by means of low temperature thermal oxidation or deposition, and depositing a high stress material on the recess-shaped insulation thin layer to form a high stress layer;
   3) depositing a polysilicon sacrificial layer on the high stress layer, and selectively etching the polysilicon sacrificial layer to a position that is a designed height of the "L" shaped composite isolation layer;
   4) selectively etching the high stress layer by using the polysilicon sacrificial layer as a protection layer, removing the polysilicon sacrificial layer, and selectively etching the insulation thin layer by using the high stress layer as a protection layer to expose a channel region window, so as to obtain the "L" shaped composite isolation layer consisted of the thin insulation layer and the high stress layer;
   5) epitaxially growing a source/drain region by using the exposed channel region window as a seed layer, performing an implantation for light doped drain, and then depositing a silicon nitride layer and performing a source/drain implantation by using the silicon nitride layer as a protection layer so as to form the source/drain;
   6) continuously depositing the silicon nitride layer, and performing chemical mechanical polishing on the silicon nitride layer by using the silicon oxide sacrificial gate as a stop layer;
   7) removing the silicon oxide sacrificial gate, performing a low temperature thermal oxidation to obtain a gate dielectric layer, depositing a polysilicon layer, and performing a chemical mechanical polishing by using the silicon nitride layer as a stop layer to obtain a polysilicon gate, so as to form the gate.

2. The fabrication method according to claim 1, characterized in that, in the step 2), the silicon dioxide insulation thin layer is formed through low temperature thermal oxidation.

3. The fabrication method according to claim 1, characterized in that, a thickness of the thin insulation layer is 0.5 to 20nm.

4. The fabrication method according to claim 1, characterized in that, a material of the high stress layer according to the step 2) is high stress silicon nitride or high stress diamond-like carbon.

5. The fabrication method according to claim 1, characterized in that, a thickness of the high stress layer is 5 to 200nm.

* * * * *